United States Patent
Baryudin et al.

(10) Patent No.: US 9,443,591 B2
(45) Date of Patent: Sep. 13, 2016

(54) STORAGE DEVICE OUT-OF-SPACE HANDLING

(71) Applicant: Seagate Technology LLC, Cupertino, CA (US)

(72) Inventors: Leonid Baryudin, Milpitas, CA (US); Earl T. Cohen, Milpitas, CA (US)

(73) Assignee: Seagate Technology LLC, Cupertino, CA (US)

( * ) Notice: Subject to any disclaimer, the term of this patent is extended or adjusted under 35 U.S.C. 154(b) by 295 days.

(21) Appl. No.: 13/748,260

(22) Filed: Jan. 23, 2013

(65) Prior Publication Data
US 2014/0208046 A1    Jul. 24, 2014

(51) Int. Cl.
| G06F 12/12 | (2016.01) |
| G11C 16/00 | (2006.01) |
| G06F 12/02 | (2006.01) |
| G06F 3/06 | (2006.01) |
| G06F 11/20 | (2006.01) |

(52) U.S. Cl.
CPC ............ *G11C 16/00* (2013.01); *G06F 3/0605* (2013.01); *G06F 3/0644* (2013.01); *G06F 3/0679* (2013.01); *G06F 12/0246* (2013.01); *G06F 11/20* (2013.01)

(58) Field of Classification Search
CPC .... G06F 12/12; G06F 3/0605; G06F 3/0644; G06F 11/20; G06F 12/0246; G06F 3/0679; G11C 16/00
USPC ....................................................... 711/170
See application file for complete search history.

(56) References Cited

U.S. PATENT DOCUMENTS

| 4,942,553 A | 7/1990 | Dalrymple et al. |
| 5,926,834 A * | 7/1999 | Carlson ............... G06F 12/0862 |
| | | 711/118 |
| 8,166,233 B2 | 4/2012 | Schibillia et al. |
| 2002/0087823 A1* | 7/2002 | Chow et al. ................... 711/170 |
| 2006/0265617 A1* | 11/2006 | Priborsky ............. G06F 1/3203 |
| | | 713/320 |
| 2007/0016812 A1* | 1/2007 | Song ..................... G06F 1/3209 |
| | | 713/300 |

(Continued)

FOREIGN PATENT DOCUMENTS

WO    2012/148828 A2    11/2012

OTHER PUBLICATIONS

Kent Smith, "Understanding SSD Over-Provisioning", Jan. 8, 2013, available at: http://www.edn.com/design/systems-design/4404566/1/Understanding-SSD-over-provisioning (last checked Jan. 23, 2013), (USA).

*Primary Examiner* — David X Yi
*Assistant Examiner* — Zubair Ahmed
(74) *Attorney, Agent, or Firm* — IP Legal Services, LLC

(57) ABSTRACT

Described embodiments detect an impending out-of-space (OOS) condition of a media. On startup, a media controller determines whether an impending OOS indicator is set from a previous startup. If the impending OOS indicator is not set, it is determined whether a free pool size has reached a threshold. The free pool is blocks of the solid-state media available to be written with data. If the free pool size has not reached the first threshold, while the startup time is less than a maximum startup time, garbage collection is performed on the solid-state media to accumulate blocks to the free pool. If the startup time reaches the maximum startup time and the free pool size has not reached the threshold, the impending OOS indicator is set and the media is operated in impending OOS mode. Otherwise, if the free pool size reaches the threshold, the media is operated in normal mode.

16 Claims, 4 Drawing Sheets

(56) References Cited

U.S. PATENT DOCUMENTS

| | | |
|---|---|---|
| 2008/0082736 A1 | 4/2008 | Chow et al. |
| 2009/0094433 A1 | 4/2009 | Thomas et al. |
| 2009/0198946 A1 | 8/2009 | Ebata |
| 2010/0274986 A1* | 10/2010 | Matsumoto ............ G06F 21/85 711/166 |
| 2010/0325351 A1 | 12/2010 | Bennett |
| 2011/0083047 A1 | 4/2011 | Stenfort |
| 2011/0099320 A1 | 4/2011 | Lucas et al. |
| 2011/0145306 A1 | 6/2011 | Boyd et al. |
| 2012/0110249 A1* | 5/2012 | Jeong .................... G06F 3/0616 711/103 |
| 2013/0179624 A1* | 7/2013 | Lambert et al. .............. 711/103 |
| 2013/0185526 A1* | 7/2013 | de la Iglesia ....... G06F 11/2094 711/154 |
| 2014/0032817 A1* | 1/2014 | Bux .................... G06F 12/0246 711/103 |

\* cited by examiner

400

STORAGE DEVICE OUT-OF-SPACE HANDLING

BACKGROUND

Flash memory is a non-volatile memory (NVM) that is a specific type of electrically erasable programmable read-only memory (EEPROM). One commonly employed type of flash memory technology is NAND flash memory. NAND flash memory requires small chip area per cell and has high endurance. However, the I/O interface of NAND flash memory does not provide full address and data bus capability and, thus, generally does not allow random access to memory locations.

NAND flash chips are typically divided into one or more banks or planes. Each bank is divided into blocks; each block is divided into pages. Each page includes a number of bytes for storing user data, error correction code (ECC) information, or both. There are three basic operations for NAND devices: read, write and erase. The read and write operations are performed on a page-by-page basis. Page sizes are generally $2^N$ bytes of user data (plus additional bytes for ECC information), where N is an integer, with typical user data page sizes of, for example, 2,048 bytes (2 KB), 4,096 bytes (4 KB), 8,192 bytes (8 KB) or more per page. Pages are typically arranged in blocks, and an erase operation is performed on a block-by-block basis. Typical block sizes are, for example, 64, 128 or more pages per block. Pages must be written sequentially, usually from a low address to a high address within a block. Lower addresses cannot be rewritten until the block is erased. Associated with each page is a spare area (typically 100-640 bytes) generally used for storage of ECC information and/or other metadata used for memory management. The ECC information is generally employed to detect and correct errors in the user data stored in the page, and the metadata might be used for mapping logical addresses to and from physical addresses. In NAND flash chips with multiple banks, multi-bank operations might be supported that allow pages from each bank to be accessed substantially in parallel.

As described, typical NVMs require that a block be erased before new data can be written to the block. Thus, NVM systems, such as solid-state disks (SSDs) employing one or more NVM chips, typically periodically initiate a "garbage collection" process to erase data that is "stale" or out-of-date to prevent the flash memory from filling up with data that is mostly out-of-date, which would reduce the realized flash memory capacity. However, NVM blocks can be erased only a limited number of times before device failure. For example, a typical single-level cell (SLC) NAND flash might only be able to be erased on the order of 100,000 times, and a multi-level cell (MLC) NAND flash might only be able to be erased on the order of 10,000 times. Therefore, over the operational life (e.g., over a rated number of program/erase (P/E) cycles for NAND flash) of an NVM, the NVM wears and blocks of flash memory will fail and become unusable. Block failure in NVMs is analogous to sector failures in hard disk drives (HDDs). Typical NVM systems might also perform wear-leveling to distribute, as evenly as possible, P/E cycles over all blocks of the NVM. Thus, over the lifetime of an NVM system, the overall storage capacity might be reduced as the number of bad blocks increases and/or the amount of storage used for system data requirements (e.g., logical-to-physical translation tables, logs, metadata, ECC, etc.) increases. As the storage capacity of the NVM system is reduced, an Out-of-Space (OOS) condition could occur, which could potentially render the NVM system non-operational and causing user data to be lost.

One way to prevent OOS conditions is to employ over-provisioning (OP). OP is the inclusion of extra storage capacity in the NVM system that is not visible to the host device as usable storage and, thus, OP is measured as the difference between the physical capacity of the NVM system and the logical capacity of the NVM system available to the user of a host device. However, typical NVM systems might employ OP sized based on worst-case conditions that are more common in enterprise devices than in consumer devices. Further, consumer device users rarely fill their drives to the full physical capacity. Thus, having a large OP size might unnecessarily reduce drive capacity, thus increasing the cost per Gigabyte, in consumer applications.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments detect an impending out-of-space (OOS) condition of a solid-state media. On startup, a media controller coupled to the solid-state media determines whether an impending OOS indicator of the solid-state media is set from a previous startup. If the impending OOS indicator is not set, the media controller determines whether a free pool size of the solid-state drive has reached a first threshold. The free pool is blocks of the solid-state media available to be written with data. If the free pool size has not reached the first threshold, while the startup time of the media controller is less than a maximum startup time, garbage collection is performed on the solid-state media to accumulate additional blocks to the free pool. If the startup time reaches the maximum startup time and the free pool size has not reached the first threshold, the impending OOS indicator is set and the solid-state media is operated in impending OOS operation mode. Otherwise, if the free pool size reaches or exceeds the first threshold, the solid-state media is operated in normal operation mode.

BRIEF DESCRIPTION OF THE DRAWING FIGURES

Other aspects, features, and advantages of described embodiments will become more fully apparent from the following detailed description, the appended claims, and the accompanying drawings in which like reference numerals identify similar or identical elements.

DETAILED DESCRIPTION

Described embodiments detect an impending out-of-space (OOS) condition of a solid-state media. On startup, a media controller coupled to the solid-state media determines whether an impending OOS indicator of the solid-state media is set from a previous startup. If the impending OOS indicator is not set, the media controller determines whether a free pool size of the solid-state drive has reached a first threshold. The free pool is blocks of the solid-state media available to be written with data. If the free pool size has not reached the first threshold, while the startup time of the media controller is less than a maximum startup time, garbage collection is performed on the solid-state media to accumulate additional blocks to the free pool. If the startup time reaches the maximum startup time and the free pool size has not reached the first threshold, the impending OOS indicator is set and the solid-state media is operated in impending OOS operation mode. Otherwise, if the free pool size reaches or exceeds the first threshold, the solid-state media is operated in normal operation mode.

Table 1 defines a list of acronyms employed throughout this specification as an aid to understanding the described embodiments:

TABLE 1

| BER | Bit Error Rate | BT | Boot Time |
|---|---|---|---|
| DOL | Drive Operational Limit | ECC | Error Correction Code |
| eDRAM | Embedded Dynamic Random Access Memory | EEPROM | Electrically Erasable Programmable Read-Only Memory |
| FC | Full Capacity | FP | Free Pools |
| FPS | Free Pool Size | HIF | Host Interface |
| IC | Integrated Circuit | I/O | Input/Output |
| IOOS | Impending Out-of-Space | MBT | Maximum Boot Time |
| NVM | Non-Volatile Memory | OOS | Out-of-Space |
| OP | Over-Provisioning | PCI-E | Peripheral Component Interconnect Express |
| P/E | Program/Erase | RFS | Root File System |
| SAS | Serial Attached SCSI | SATA | Serial Advanced Technology Attachment |
| SCSI | Small Computer System Interface | SoC | System on Chip |
| SRAM | Static Random Access Memory | SRIO | Serial Rapid Input/Output |
| SSD | Solid-State Disk | UE | User Experience |
| US | Used Space | USB | Universal Serial Bus |
| USSL | Used Space Safe Limit | WSL | Write Stall Limit |

Figure 1:
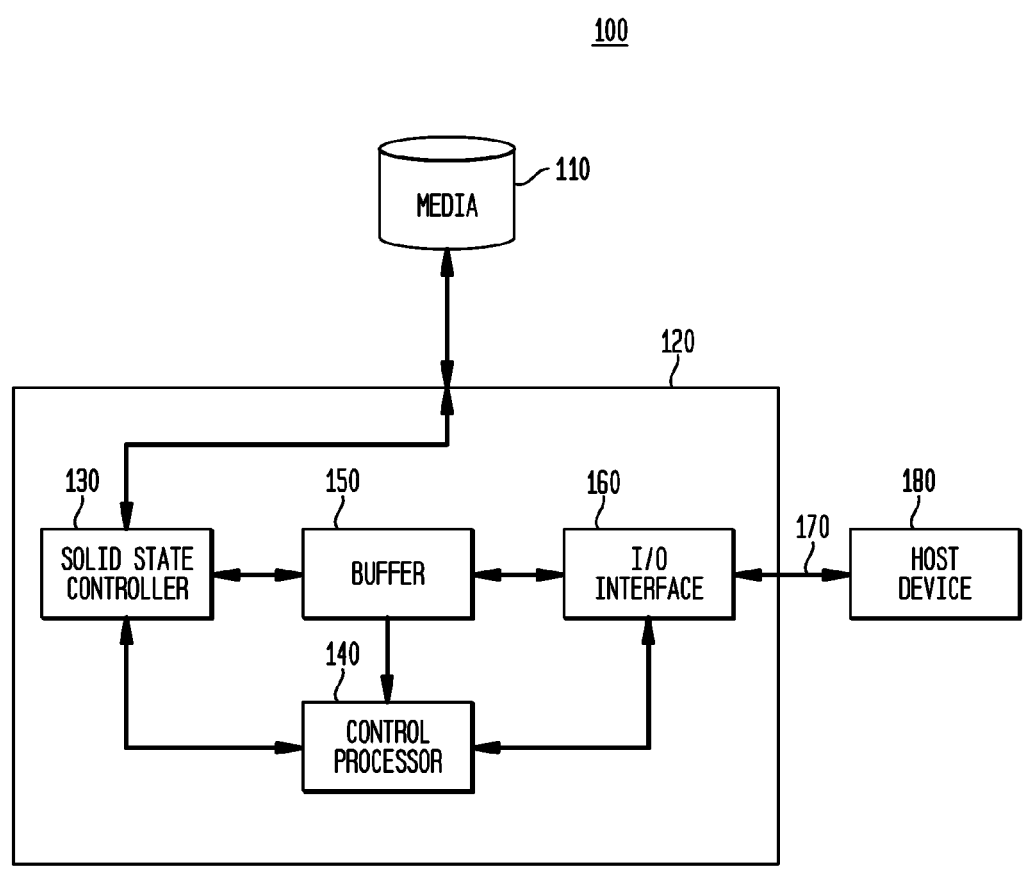
FIG. 1 shows a block diagram of a flash memory storage system in accordance with exemplary embodiments.

FIG. 1 shows a block diagram of non-volatile memory (NVM) storage system 100. NVM storage system 100 includes media 110, which is coupled to media controller 120. Media 110 might be implemented as a NAND flash solid-state disk (SSD), a magnetic storage media such as a hard disk drive (HDD), or as a hybrid solid-state and magnetic system. Media 110 might typically employ one or more NVM chips. Media controller 120 includes solid state controller 130, control processor 140, buffer 150 and I/O interface 160. Media controller 120 controls transfer of data between media 110 and host device 180 that is coupled to communication link 170. Media controller 120 might be implemented as a system-on-chip (SoC) or other integrated circuit (IC). Solid state controller 130 might be used to access memory locations in media 110, and might typically implement low-level, device specific operations to interface with media 110. Buffer 150 might be a RAM buffer employed to act as a cache for control processor 140 and/or as a read/write buffer for operations between solid state media 110 and host device 180. For example, data might generally be temporarily stored in buffer 150 during transfer between solid state media 110 and host device 180 via I/O interface 160 and link 170. Buffer 150 might be employed to group or split data to account for differences between a data transfer size of communication link 170 and a storage unit size (e.g., page size, sector size, or mapped unit size) of media 110. Buffer 150 might be implemented as a static random-access memory (SRAM) or as an embedded dynamic random-access memory (eDRAM) internal to media controller 120, although buffer 150 could also include memory external to media controller 120 (not shown), which might typically be implemented as a double-data-rate (e.g., DDR-3) DRAM.

Control processor 140 communicates with solid state controller 130 to control data access (e.g., read or write operations) data in media 110. Control processor 140 might be implemented as one or more Pentium®, Power PC®, Tensilica® or ARM processors, or a combination of different processor types (Pentium® is a registered trademark of Intel Corporation, Tensilica® is a trademark of Tensilica, Inc., ARM processors are by ARM Holdings, plc, and Power PC® is a registered trademark of IBM). Although shown in FIG. 1 as a single processor, control processor 140 might be implemented by multiple processors (not shown) and include software/firmware as needed for operation, including to perform threshold optimized operations in accordance with described embodiments.

Communication link 170 is used to communicate with host device 180, which might be a computer system that interfaces with NVM system 100. Communication link 170 might be a custom communication link, or might be a bus that operates in accordance with a standard communication protocol such as, for example, a Small Computer System Interface ("SCSI") protocol bus, a Serial Attached SCSI ("SAS") protocol bus, a Serial Advanced Technology Attachment ("SATA") protocol bus, a Universal Serial Bus ("USB"), an Ethernet link, an IEEE 802.11 link, an IEEE 802.15 link, an IEEE 802.16 link, a Peripheral Component Interconnect Express ("PCI-E") link, a Serial Rapid I/O ("SRIO") link, or any other similar interface link for connecting a peripheral device to a computer.

Figure 2:
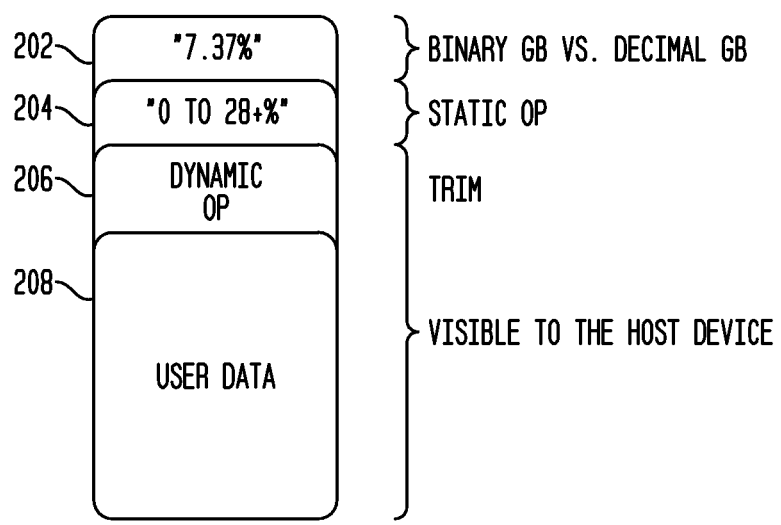
FIG. 2 shows a block diagram of an exemplary arrangement of the flash memory of the flash memory storage system of FIG. 1.

FIG. 2 shows a block diagram of an exemplary arrangement of solid state media 110 of FIG. 1. As shown in FIG. 2, media 110 might be implemented with over-provisioning (OP) to prevent Out-of-Space (OOS) conditions from occurring. As shown in FIG. 2, OP might be achieved in three ways. First, SSD manufacturers typically employ the term "GB" to represent a decimal Gigabyte but a decimal Gigabyte (1,000,000,000 or $10^9$ bytes) and a binary Gibibyte (1,073,741,824 or $2^{30}$ bytes) are not equal. Thus, since the physical capacity of the SSD is based on binary GB, if the logical capacity of the SSD is based on decimal GB, the SSD might have a built-in OP of 7.37% (e.g., $[(2^{30}-10^9)/10^9]$). This is shown in FIG. 2 as "7.37%" OP 202. Secondly, OP might be implemented by setting aside a specific amount of physical memory for system use that is not available to host device 180. For example, a manufacturer might publish a specification for their SSD having a logical capacity of 100 GB, 120 GB or 128 GB, based on a total physical capacity of 128 GB, thus possibly achieving exemplary OPs of 28%, 7% or 0%, respectively. This is shown in FIG. 2 as static OP ("0 to 28+%") 204. Third, some storage protocols (e.g., SATA) support a "TRIM" command that enables host device 180 to designate blocks of previously saved data as unneeded or invalid such that NVM system 100 will not save those blocks during garbage collection. Prior to the TRIM command, if host device 180 erased a file, the file was removed from the host device records, but the actual contents of NVM system 100 were not actually erased, which cased NVM system 100 to maintain invalid data during garbage collection, thus reducing the NVM capacity. The OP due to efficient garbage collection by employing the TRIM command is shown in FIG. 2 as dynamic OP 206. Dynamic OP 206 and user data 208 form the area of media 110 that is accessible to host device 180, while OP areas 202 and 204 are inaccessible to host device 180.

However, typical NVM systems might employ OP sized based on worst-case conditions that are more common in enterprise devices than in consumer devices. Further, consumer device users rarely fill their drives to the full physical capacity. Thus, having a large OP size might unnecessarily reduce drive capacity in consumer applications. Described embodiments prevent OOS conditions in consumer SSDs without requiring a large OP. In particular, described embodiments detect an Impending OOS condition before the SSD is completely full, reducing the risk of a false-positive OOS detection during normal functionality and also allowing notification of a user of the SSD such that data on the SSD can be recovered.

Figure 3:
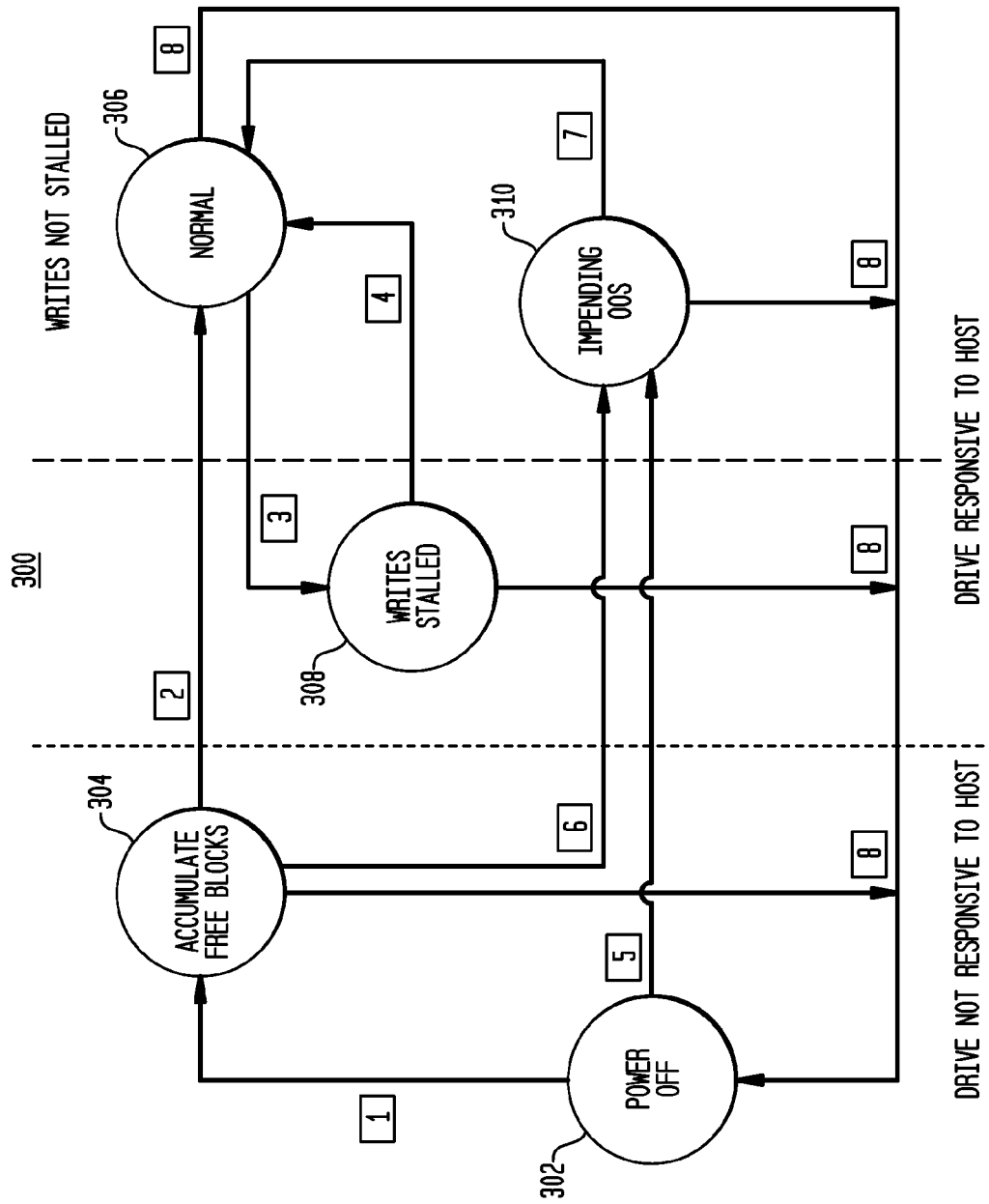
FIG. 3 shows an exemplary state diagram of an out-of-space prediction algorithm of the flash memory storage system of FIG. 1.

FIG. 3 shows state diagram 300 indicating states of and Impending OOS detection algorithm employed by NVM system 100. As shown in FIG. 3, media 110 is initially in power off state 302. When media 110 is powered on, media controller 120 checks the state of an Impending OOS indicator of system 100. In some embodiments, the Impending OOS indicator is persistent, for example, stored to the Root File System (RFS) (or other persistent metadata storage area of media 110 or media controller 120) each time the Impending OOS indicator is changed. As indicated by transition 1, if the Impending OOS indicator does not indicate an Impending OOS condition or the used space (US) of media 110 has not reached a predetermined Used Space Safe Limit (USSL), then system 100 transitions to accumulate free blocks state 304. In an exemplary embodiment, the US of media 110 is the amount of media taken out of circulation by bad blocks, system data, user data, and any other unavailable blocks, and the USSL is selected to be 95% of the full physical capacity of media 110. As indicated by transition 5, if the Impending OOS indicator indicates an Impending OOS condition and the used space (US) of media 110 has reached or exceeded the predetermined Used Space Safe Limit (USSL), then system 100 transitions to Impending OOS state 310.

At accumulate free blocks state 304, system 100 performs garbage collection to accumulate empty blocks of media 110 into a free pool (FP). The free pool is a pool of blocks of media 110 that do not contain valid data and, thus, can be used to write new data. At accumulate free blocks state 304, if system 100 accumulates a free pool size (FPS) that is at least equal to a Drive Operational Limit (DOL) (e.g., FPS≥DOL), then power up of system 100 continues to normal state 306, as indicated by transition 2. The drive operational limit is the minimum amount of free blocks of media 110 that is necessary for system 100 to be operational (e.g., respond to operations from host device 180). In exemplary embodiments, the drive operational limit might be 1% of the total number of blocks of media 110. At normal state 306, system 100 is fully operational and is responsive to host operations.

If at any time during operation of system 100 at normal state 306, the free pool size (FPS) becomes less than a Write Stall Limit (WSL) of system 100 (e.g., FPS<WSL), then, as indicated by transition 3, system 100 continues to writes stalled state 308. At writes stalled state 308, write operations from host device 180 are stalled (e.g., slowed down and/or rejected) until the free pool size (FPS) becomes at least equal to the write stall limit (WSL) (e.g., FPS≥WSL), as indicated by transition 4, where system 100 returns to normal state 306. In exemplary embodiments, the write stall limit might be slightly less than the drive operational limit, for example, 0.9% of the total number of blocks of media 110.

If, at accumulate free blocks state 304, system 100 cannot accumulate a large enough free pool to become operational (e.g., the free pool size (FPS) remains less than the Drive Operational Limit (DOL) (e.g., FPS<DOL)), and the elapsed boot time (BT) of system 100 has reached a maximum boot time (MBT) (e.g., BT≥MBT), then system 100 transitions to Impending OOS state 310 as indicated by transition 6. In impending OOS state 310, write operations from host device 180 are throughput limited to a predetermined maximum value (e.g., 100 KB/sec) to prolong drive life.

If, while in impending OOS state 310 the amount of used space (US) becomes less than the predetermined Used Space Safe Limit (USSL), for example, due to a TRIM operation, then system 100 transitions to normal state 306 as indicated by transition 7. In some exemplary embodiments, system 100 might only transition to impending OOS state 310 on a power on condition (e.g., from one of power off state 302 or accumulate free pools state 304, but not from normal state 306).

Thus, in some embodiments, system 100 might reboot (e.g., power off and then power on, as indicated by transition 8) when the free pool size becomes less than the Drive Operational Limit (DOL) (e.g., FPS<DOL). Upon reboot, system 100 would transition to writes stalled state 308, via normal state 306, for host device 180 to "discard" the drive, as indicated by transitions 2 and 3. For example, in some embodiments, host device 180 might automatically reboot (e.g., in a Microsoft Windows® system, the host device might "blue screen" and reboot) or alternatively the host device might notify the user that a system reboot is necessary and then shut down and reboot. In some embodiments, if a "blue screen" is shown, host device 180 might determine that system 100 is non-functional and inoperable. Thus, in writes stalled state 308, a user experience (UE) of a user of host device 180 changes sharply, since the drive becomes less responsive, slower, and might need to be periodically rebooted. However, the writes stalled state 308 allows the user time to remove data from media 110, reformat media 110, perform a TRIM operation, etc., such that the drive does not reach its maximum physical capacity, which could cause media 110 to become entirely inaccessible. As indicated by transitions 8, in any state of operation, if system 100 is powered off, the system transitions to power off state 302.

In described embodiments, at impending OOS state 310, system 100 might generate a notification of the impending OOS condition to be delivered to the user of host device 180. User notification of the impending OOS condition might be via special host interface (HIF) commands (e.g., SMART Attributes for SATA). The special HIF commands might report the used space (US), free pool size (FPS), and other parameters together with the operational state of system 100 such that the impending OOS condition is reported to host device 180 and, thus, the user, for example by displaying a dialog box warning on a screen of host device 180. When the impending OOS condition is reported to the user, the user might decide to delete data from media 110, such that a TRIM operation can increase the free pool size.

Figure 4:
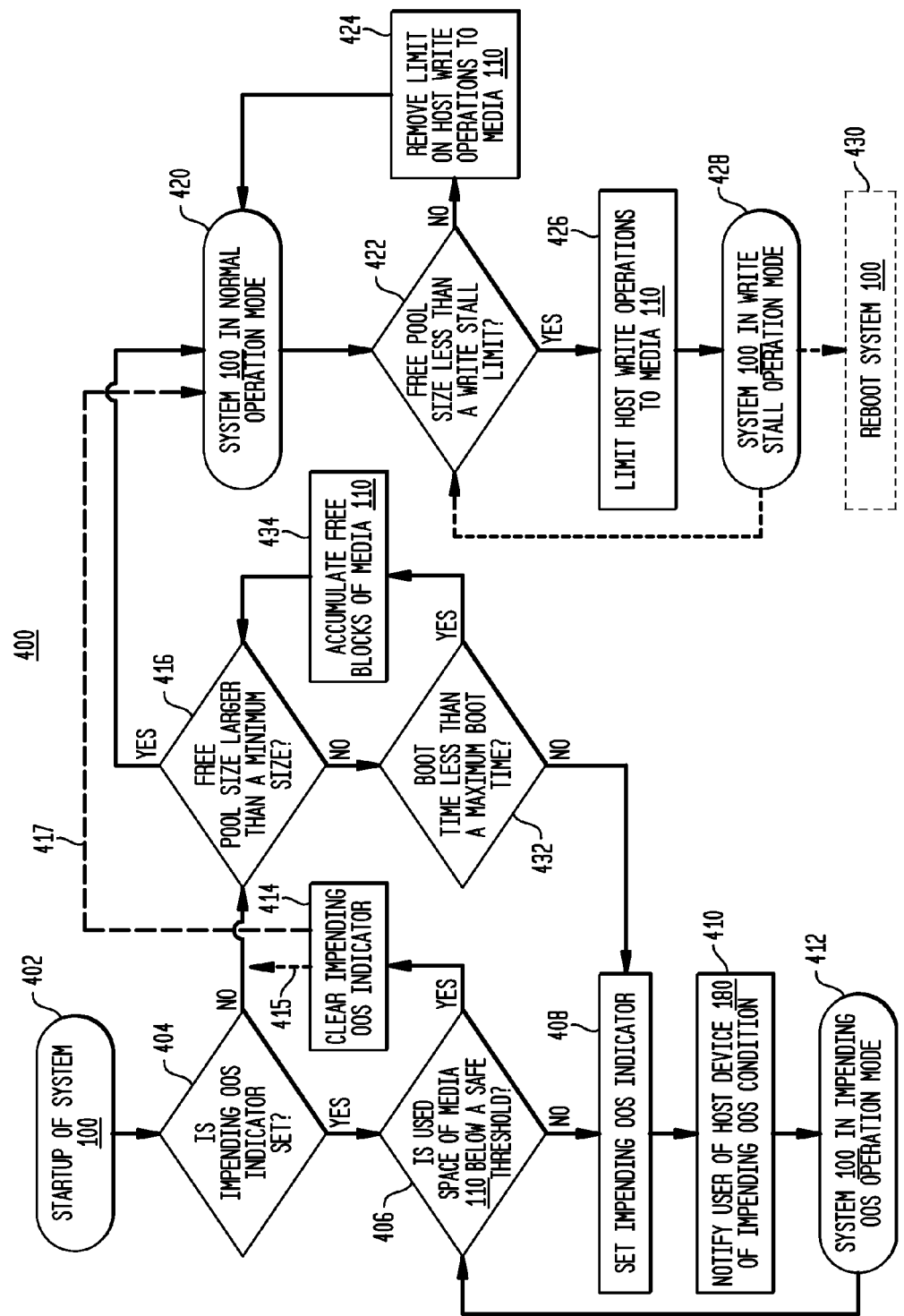
FIG. 4 shows an exemplary flow diagram of an out-of-space prediction algorithm of the flash memory storage system of FIG. 1.

FIG. 4 shows a flow diagram of operation process 400 of system 100. At step 402, system 100 starts, for example when host device 180 is powered on. At step 404, media controller 120 checks whether a previously saved Impending OOS (IOOS) indicator is set. If, at step 404, the IOOS indicator is set, then process 400 continues to step 406. At step 406, system 100 checks whether the used space (e.g., space used to store valid data) of media 110 is less than a safe limit (e.g., US<USSL). If, at step 406, the used space is below the safe limit, then, at step 414, the IOOS indicator is cleared and process 400 proceeds to step 416. Step 416 is described below. If, at step 406, the used space of media 110 has reached or exceeded the safe limit (e.g., US≥USSL), then, at step 408, the IOOS indicator is set (if it was not already previously set). At step 410, a user of host device 180 is notified that the used space of media 110 has almost reached the full physical capacity of media 110 and that the system is operating in an impending out-of-space condition. At step 412, system 100 operates in IOOS mode. During operation in IOOS mode, system 100 periodically checks, at step 406 whether the used space of media 110 has become less than the safe limit (e.g., US<USSL) such that the IOOS indicator can be cleared at step 414. As indicated by dashed line 417, typical embodiments of system 100 might not check the free pool size again after startup, and might proceed directly from clearing the IOOS indicator at step 414 to placing system 100 in normal operation mode at step 420 since the used space of media 110 is below the safe threshold (e.g., at step 406). As indicated by dashed line 415, some alternative embodiments might clear the IOOS indicator at step 414 and again check the free pool size (e.g., step 416) and possibly perform garbage collection to increase the size of the free pool (e.g., step 434) during an otherwise idle time of system 100. Otherwise, at step 406, if the used space of media 110 is not less than the safe limit (e.g., US>USSL), operation of system 100 stays in IOOS mode (e.g., steps 408-412).

If, at step 404, the IOOS indicator is not set, then process 400 continues to step 416. At step 416, the current free pool size (FPS) of media 110 is compared with the drive operational limit (DOL) of media 110. If, at step 416, FPS<DOL (e.g., additional free blocks are needed), then at step 432, if a maximum boot time (MBT) has not yet been reached (e.g., current boot time<MBT), then at step 434, garbage collection is performed to attempt to gain additional free blocks and increase the free pool size. During garbage collection, system 100 periodically returns back to steps 416 and 432 to verify whether either enough free blocks have been accumulated (step 416) or a maximum boot time (step 432) has been reached.

If, at step 416, FPS≥DOL, then, at step 420, system 100 is in normal operation mode. In normal operation mode, media 110 is responsive to operations from host device 180 without additional limits on operation data amounts and/or data throughput to preserve free space on media 110 since it can be presumed that media 110 has sufficient free space to ensure proper operation. If, at step 432, the maximum boot time is reached (e.g., BT≥MBT), then process 400 proceeds to step 408, and system 100 is in IOOS operation mode (e.g., steps 408-412).

During normal operation (e.g., step 420), system 100 periodically checks, at step 422, whether the current free pool size (FPS) of media 110 has reached a write stall limit (WSL) of media 110. If, at step 422, FPS<WSL (e.g., additional free blocks are needed), then at step 426, write operations to media 110 from host device 180 are limited (e.g., in data amount and/or data throughput) to preserve free space on media 110, and at step 428, system 100 operates in the write stall operation mode. As shown by the dashed lines of step 430, system 100 might optionally reboot during write stall operation mode (e.g., if the free pool size becomes sufficiently small). At system reboot, system 100 might restart process 400 at step 402. As also indicated by the dashed lines, during write stall operation mode (e.g., step 428) system 100 might periodically check, at step 422, whether the current free pool size (FPS) of media 110 has become large enough such that, at step 424, limits on host write operations can be removed and system 100 can be placed in normal operation mode at step 420 (e.g., if FPS≥WSL).

Thus, as described herein, described embodiments detect an impending out-of-space (OOS) condition of a solid-state media. On startup, a media controller coupled to the solid-state media determines whether an impending OOS indicator of the solid-state media is set from a previous startup. If the impending OOS indicator is not set, the media controller determines whether a free pool size of the solid-state drive has reached a first threshold. The free pool is blocks of the solid-state media available to be written with data. If the free pool size has not reached the first threshold, while the startup time of the media controller is less than a maximum startup time, garbage collection is performed on the solid-state media to accumulate additional blocks to the free pool. If the startup time reaches the maximum startup time and the free pool size has not reached the first threshold, the impending OOS indicator is set and the solid-state media is operated in impending OOS operation mode. Otherwise, if the free pool size reaches or exceeds the first threshold, the solid-state media is operated in normal operation mode.

Reference herein to "one embodiment" or "an embodiment" means that a particular feature, structure, or characteristic described in connection with the embodiment can be included in at least one embodiment. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

While the exemplary embodiments have been described with respect to processing blocks in a software program, including possible implementation as a digital signal processor, micro-controller, or general-purpose computer, described embodiments are not so limited. As would be apparent to one skilled in the art, various functions of software might also be implemented as processes of circuits. Such circuits might be employed in, for example, a single integrated circuit, a multi-chip module, a single card, or a multi-card circuit pack.

Described embodiments might also be embodied in the form of methods and apparatuses for practicing those methods. Described embodiments might also be embodied in the form of program code embodied in non-transitory tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing described embodiments. Described embodiments might can also be embodied in the form of program code, for example, whether stored in a non-transitory machine-readable storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the described embodiments. When implemented on a general-purpose processor, the program code segments combine with the processor to provide a unique device that operates analogously to specific logic circuits. Described embodiments might also be embodied in the form of a bitstream or other sequence of signal values electrically or optically transmitted through a medium, stored magnetic-field variations in a magnetic recording medium, etc., generated using a method and/or an apparatus of the described embodiments.

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various described embodiments.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard. Unless explicitly stated otherwise, each numerical value and range should be interpreted as being approximate as if the word "about" or "approximately" preceded the value of the value or range.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports might be referred to by the same name and are interchangeable for purposes here.

It will be further understood that various changes in the details, materials, and arrangements of the parts that have been described and illustrated in order to explain the nature of the described embodiments might be made by those skilled in the art without departing from the scope expressed in the following claims.

We claim:

1. A method of detecting, by a media controller coupled to a host device and a solid-state media, an impending out-of-space (OOS) condition of the solid-state media, the solid-state media having a physical storage capacity, the method comprising:
on startup of the media controller:
determining, by the media controller, whether an impending OOS indicator of the solid-state media is set from a previous startup of the media controller;
if the impending OOS indicator is not set:
determining, whether an OOS condition of the solid-state media has occurred, by determining whether a free pool size of the solid-state drive has reached a first threshold, wherein the free pool comprises blocks of the solid-state media available to be written with data;
if the OOS condition of the solid-state media has occurred:
setting the impending OOS indicator and operating the solid-state media in an impending OOS operation mode;
otherwise, if the OOS condition has not occurred:
operating the solid-state media in a normal operation mode;
wherein, the normal operation mode comprises:
checking, periodically, whether the free pool size of the solid-state drive becomes less than a second threshold and, if so:
operating the solid-state media in a write stall operation mode, wherein, in the write stall operation mode, the media controller limits write operations from the host device to the solid-state media to a predetermined, non-zero, maximum data throughput, thereby preserving free space on the solid-state media; and
if the free pool size has not reached the first threshold:
while a current startup time of the media controller is less than a maximum startup time, performing garbage collection on the solid-state media to accumulate additional blocks to the free pool;
if the current startup time reaches the maximum startup time and the free pool size has not reached the first threshold:
setting the impending OOS indicator and operating the solid-state media in the impending OOS operation mode;
otherwise, if the free pool size reaches or exceeds the first threshold:
operating the solid-state media in the normal operation mode.

2. The method of claim 1, wherein the first threshold is 1% of the physical storage capacity of the solid-state media.

3. The method of claim 1, further comprising:
if the impending OOS indicator of the solid-state media is set from a previous startup of the media controller:
determining whether used space of the solid-state media is below a safe threshold and, if so:
clearing the impending OOS indicator;
otherwise:
maintaining the impending OOS indicator and operating the solid-state media in the impending OOS operation mode.

4. The method of claim 3, wherein the safe threshold is 95% of the physical storage capacity of the solid-state media.

5. The method of claim 1, wherein the predetermined maximum data throughput is 100 KB/sec.

6. The method of claim 1, wherein write operations are limited to a predetermined data size.

7. The method of claim 1, further comprising, during the write stall operation mode:
checking, periodically, whether the free pool size of the solid-state drive remains less than a second threshold and, if so:
continuing operating the solid-state media in a write stall operation mode;
otherwise:
operating the solid-state media in the normal operation mode.

8. The method of claim 1, further comprising, during the write stall operation mode:
restarting the host device and media controller.

9. The method of claim 1, wherein the second threshold is a write stall limit of the solid-state media, and the write stall limit is 0.9% of the physical storage capacity of the solid-state media.

10. The method of claim 1, further comprising:
notifying the host device that the solid-state media is operating in the impending OOS operation mode.

11. The method of claim 10, wherein, in response to receiving the notification that the solid-state media is operating in the impending OOS operation mode, the host device provides a notification to a user of the host device.

12. The method of claim 11, further comprising:
receiving, by the host device, commands from the user to delete data from the solid-state media; and
sending, by the host device, a TRIM command to the media controller; and
in response to the TRIM command, erasing, by the media controller, one or more blocks of the solid-state media.

13. The method of claim 1, wherein the impending OOS indicator is persistently stored in a root file system of the solid-state media.

14. A non-transitory machine-readable medium, having encoded thereon program code, wherein, when the program code is executed by a machine, the machine implements a method of detecting, by a media controller coupled to a host device and a solid-state media, an impending out-of-space (OOS) condition of the solid-state media, the solid-state media having a physical storage capacity, the method comprising:
on startup of the media controller:
determining, by the media controller, whether an impending OOS indicator of the solid-state media is set from a previous startup of the media controller;
if the impending OOS indicator is not set:
determining, by the media controller, whether a free pool size of the solid-state drive has reached a first threshold, wherein the free pool comprises blocks of the solid-state media available to be written with data;
if the free pool size has not reached the first threshold:
while a current startup time of the media controller is less than a maximum startup time, performing garbage collection on the solid-state media to accumulate additional blocks to the free pool;
if the current startup time reaches the maximum startup time and the free pool size has not reached the first threshold:
setting the impending OOS indicator and operating the solid-state media in an impending OOS operation mode;
otherwise, if the free pool size reaches or exceeds the first threshold:
operating the solid-state media in a normal operation mode; and
during the normal operation mode:
checking, periodically, whether the free pool size of the solid-state drive becomes less than a second threshold and, if so:
operating the solid-state media in a write stall operation mode, wherein, in the write stall operation mode, the media controller limits write operations from the host device to the solid-state media to a predetermined, non-zero, maximum data throughput, thereby preserving free space on the solid-state media; and
if the free pool size has not reached the first threshold:
while a current startup time of the media controller is less than a maximum startup time, performing garbage collection on the solid-state media to accumulate additional blocks to the free pool;
if the current startup time reaches the maximum startup time and the free pool size has not reached the first threshold:
setting the impending OOS indicator and operating the solid-state media in the impending OOS operation mode;
otherwise, if the free pool size reaches or exceeds the first threshold:
operating the solid-state media in the normal operation mode.

15. The non-transitory machine-readable medium of claim 14, further comprising:
if the impending OOS indicator of the solid-state media is set from a previous startup of the media controller:
determining whether used space of the solid-state media is below a safe threshold and, if so:
clearing the impending OOS indicator;
otherwise:
maintaining the impending OOS indicator and operating the solid-state media in the impending OOS operation mode.

16. A media controller for a solid-state media having a physical storage capacity, the media controller configured to detect an impending out-of-space (OOS) condition of the solid-state media, the media controller comprising:
an input/output interface configured to communicate with a host device coupled to the media controller;
a control processor coupled to the input/output interface, the control processor configured to, on startup of the media controller:
determine whether an impending OOS indicator of the solid-state media is set from a previous startup of the media controller;
if the impending OOS indicator is not set:
determine whether a free pool size of the solid-state drive has reached a first threshold, the free pool comprising blocks of the solid-state media available to be written with data;
if the free pool size has not reached the first threshold:
while a current startup time of the media controller is less than a maximum startup time, perform garbage collection on the solid-state media to accumulate additional blocks to the free pool;
if the current startup time reaches the maximum startup time and the free pool size has not reached the first threshold:
set the impending OOS indicator and operate the solid-state media in an impending OOS operation mode;
otherwise, if the free pool size reaches or exceeds the first threshold:
operate the solid-state media in a normal operation mode;
if the impending OOS indicator of the solid-state media is set from a previous startup of the media controller:
determine whether used space of the solid-state media is below a safe threshold and, if so: clear the impending OOS indicator;

otherwise: maintain the impending OOS indicator and operate the solid-state media in the impending OOS operation mode;
check, periodically during normal operation mode, whether the free pool size of the solid-state drive becomes less than a second threshold and, if so:
 operate the solid-state media in a write stall operation mode, wherein, in the write stall operation mode, the media controller limits write operations from the host device to the solid-state media to a predetermined, non-zero, maximum data throughput, thereby preserving free space on the solid-state media; and
if the free pool size has not reached the first threshold:
 while a current startup time of the media controller is less than a maximum startup time, performing garbage collection on the solid-state media to accumulate additional blocks to the free pool;
 if the current startup time reaches the maximum startup time and the free pool size has not reached the first threshold:
  setting the impending OOS indicator and operating the solid-state media in the impending OOS operation mode;
 otherwise, if the free pool size reaches or exceeds the first threshold:
 operating the solid-state media in the normal operation mode.

* * * * *